(12) United States Patent
Okabe et al.

(10) Patent No.: US 10,643,967 B2
(45) Date of Patent: May 5, 2020

(54) POWER SEMICONDUCTOR DEVICE THAT INCLUDES A COPPER LAYER DISPOSED ON AN ELECTRODE AND LOCATED AWAY FROM A POLYIMIDE LAYER AND METHOD FOR MANUFACTURING THE POWER SEMICONDUCTOR DEVICE

(71) Applicant: Mitsubishi Electric Corporation, Chiyoda-ku (JP)

(72) Inventors: Hiroaki Okabe, Tokyo (JP); Yosuke Nakanishi, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/092,564

(22) PCT Filed: Apr. 25, 2017

(86) PCT No.: PCT/JP2017/016317
§ 371 (c)(1),
(2) Date: Oct. 10, 2018

(87) PCT Pub. No.: WO2017/199706
PCT Pub. Date: Nov. 23, 2017

(65) Prior Publication Data
US 2019/0172812 A1  Jun. 6, 2019

(30) Foreign Application Priority Data
May 18, 2016  (JP) .................. 2016-099270

(51) Int. Cl.
*H01L 23/00* (2006.01)
*H01L 21/768* (2006.01)
(Continued)

(52) U.S. Cl.
CPC .............. *H01L 24/48* (2013.01); *H01L 21/28* (2013.01); *H01L 21/3205* (2013.01);
(Continued)

(58) Field of Classification Search
CPC ............... H01L 24/48; H01L 24/85; H01L 2224/04042; H01L 2224/05647; H01L 2224/48847; H01L 2224/73265
See application file for complete search history.

(56) References Cited

U.S. PATENT DOCUMENTS 6,727,593 B2 *  4/2004  Toyoda ............. H01L 21/76834
                                                257/762
7,416,932 B2 *  8/2008  Itou ........................ H01L 24/05
                                                438/197
(Continued)

FOREIGN PATENT DOCUMENTS

JP    2001-196413 A    7/2001
JP    2007-35875 A     2/2007
(Continued)

OTHER PUBLICATIONS

International Search Report dated Jul. 11, 2017, in PCT/JP2017/016317, filed Apr. 25, 2017.

*Primary Examiner* — Nduka E Ojeh
(74) *Attorney, Agent, or Firm* — Oblon, McClelland, Maier & Neustadt, L.L.P.

(57) ABSTRACT

An electrode is disposed on a semiconductor layer. A polyimide layer has an opening disposed on the electrode, covers the edge of the electrode, and extends onto the electrode. A copper layer is disposed on the electrode within the opening, and located away from the polyimide layer on the electrode. A copper wire has one end joined on the copper layer.

11 Claims, 3 Drawing Sheets

(51) Int. Cl.
  *H01L 29/12*    (2006.01)
  *H01L 21/28*    (2006.01)
  *H01L 29/78*    (2006.01)
  *H01L 21/3205*  (2006.01)
  *H01L 23/522*   (2006.01)

(52) U.S. Cl.
  CPC .......... *H01L 21/768* (2013.01); *H01L 23/522* (2013.01); *H01L 24/03* (2013.01); *H01L 24/05* (2013.01); *H01L 24/85* (2013.01); *H01L 29/12* (2013.01); *H01L 29/78* (2013.01); *H01L 24/32* (2013.01); *H01L 24/45* (2013.01); *H01L 24/73* (2013.01); *H01L 2224/04042* (2013.01); *H01L 2224/05* (2013.01); *H01L 2224/05124* (2013.01); *H01L 2224/05647* (2013.01); *H01L 2224/32221* (2013.01); *H01L 2224/45015* (2013.01); *H01L 2224/45147* (2013.01); *H01L 2224/4847* (2013.01); *H01L 2224/48847* (2013.01); *H01L 2224/4911* (2013.01); *H01L 2224/73265* (2013.01); *H01L 2224/8592* (2013.01); *H01L 2924/05042* (2013.01); *H01L 2924/07025* (2013.01); *H01L 2924/10272* (2013.01); *H01L 2924/13055* (2013.01); *H01L 2924/13091* (2013.01); *H01L 2924/2064* (2013.01); *H01L 2924/20641* (2013.01); *H01L 2924/3511* (2013.01); *H01L 2924/3512* (2013.01)

(56) References Cited

U.S. PATENT DOCUMENTS

| | | |
|---|---|---|
| 2001/0008311 A1 | 7/2001 | Harada et al. |
| 2003/0075804 A1* | 4/2003 | Gleixner ................ H01L 24/03 257/762 |
| 2008/0093729 A1* | 4/2008 | Siepe .................. H01L 23/3735 257/703 |
| 2008/0119036 A1* | 5/2008 | Daubenspeck ...... B23K 1/0016 438/612 |
| 2008/0203568 A1* | 8/2008 | Tanaka .................... H01L 24/05 257/738 |
| 2013/0306985 A1 | 11/2013 | Fujii |
| 2014/0284790 A1 | 9/2014 | Matsumoto et al. |
| 2016/0225730 A1* | 8/2016 | Tatsumi ............ H01L 23/49827 |
| 2017/0062362 A1* | 3/2017 | Sekikawa ................ H01L 24/05 |
| 2017/0278931 A1* | 9/2017 | Iguchi ................ H01L 29/1608 |
| 2018/0053737 A1 | 2/2018 | Ogawa et al. |

FOREIGN PATENT DOCUMENTS

| | | |
|---|---|---|
| JP | 2009-177104 A | 8/2009 |
| JP | 2013-243166 A | 12/2013 |
| JP | 2014-82367 A | 5/2014 |
| JP | 2014-110284 A | 6/2014 |
| JP | 2014-187073 A | 10/2014 |
| JP | 2015-23249 A | 2/2015 |
| WO | WO 2016/143557 A1 | 9/2016 |

* cited by examiner

US 10,643,967 B2

POWER SEMICONDUCTOR DEVICE THAT INCLUDES A COPPER LAYER DISPOSED ON AN ELECTRODE AND LOCATED AWAY FROM A POLYIMIDE LAYER AND METHOD FOR MANUFACTURING THE POWER SEMICONDUCTOR DEVICE

TECHNICAL FIELD

The present invention relates to power semiconductor devices and methods for manufacturing the same, and particularly, to a power semiconductor device including a copper wire and a method for manufacturing the same.

BACKGROUND ART

Conventionally, power semiconductor elements made of silicon (Si) have been widely used. To save energy, power semiconductor elements have recently required improvements in property. Accordingly, power semiconductor elements made of silicon carbide (SiC) have begun to be used as next-generation power semiconductor elements that are resistant to high voltage and involve small loss. Examples of a power semiconductor element include a Field-Effect-Transistor (FET) having a Metal-Oxide-Semiconductor (MOS) structure, and a Schottky diode. A SiC-MOSFET can have a structure in conformance with a basic element-structure of a Si-MOSFET. Although the SiC-MOSFET and the Si-MOSFET have such a common structure, the SiC-MOSFET can operate at a higher temperature than the Si-MOSFET because SiC has a wider bandgap than Si. To be specific, the SiC-MOSFET can operate at 200° C. or more, whereas the Si-MOSFET commonly operates at less than 200° C. As described above, the SiC power semiconductor element can operate at higher temperature than the Si power semiconductor element. In addition, SiC achieves advantages such as smaller loss and higher-speed operation.

Wire bonding is used as a typical method for electrical connection between a power semiconductor element and an external circuit. That is, a conductor wire is joined to an electrode disposed on a surface of the element. Although a conventional and widely-used conductor wire is an aluminum (Al) wire, a recent study provides a copper (Cu) wire. Cu has a higher conductivity than Al. Hence, a Cu wire has a reduced electrical resistance. Moreover, Cu has higher yield strength than Al. Hence, a Cu wire has enhanced reliability against temperature cycles.

A Cu wire has a greater impact on a site where the wire is joined than an Al wire. In particular, power semiconductor elements control large current; therefore, they require a large-diameter wire, which has a greater impact in wire bonding.

For one thing, Japanese Patent Application Laid-Open No. 2013-243166 (Patent Document 1) discloses a technique of joining a copper wire to an electrode of a SiC power semiconductor element. The electrode has a titanium layer and an aluminum layer. The copper wire is joined to the aluminum layer along with ultrasonic vibration. This publication describes that the titanium layer, which is a hard material, reduces damage to the electrode of the power semiconductor element. Around the electrode, a polyimide layer is disposed so as to be in contact with the edge of the electrode. The polyimide layer serves as a protective film around the electrode. The protective film enhances the reliability of the power semiconductor element.

For another thing, Japanese Patent Application Laid-Open No. 2014-082367 (Patent Document 2) discloses joining a wire made of Cu or an alloy of Cu (hereinafter simply referred to as a "copper wire" or "Cu wire") to an electrode on a SiC monocrystalline chip. The electrode includes a top layer made of Cu or an alloy of Cu, and a protective layer with high hardness. This publication describes that the protective layer prevents cracking in the chip in wire bonding. Moreover, the wire and the top layer, both of which are made of Cu or an alloy of Cu, are well joined to each other.

PRIOR ART DOCUMENTS

Patent Documents

Patent Document 1: Japanese Patent Application Laid-Open No. 2013-243166
Patent Document 2: Japanese Patent Application Laid-Open No. 2014-082367

SUMMARY

Problem to be Solved by the Invention

Assuming that, as a protective layer, the polyimide layer in Patent Document 1 is used in the configuration in Patent Document 2, provided is a configuration in which a layer made of Cu or an alloy of Cu (hereinafter simply referred to as a "copper layer" or "Cu layer") is in contact with the polyimide layer. In this case, a temperature rise along with the operation of the semiconductor element causes Cu atoms to diffuse into the polyimide layer. This can degrade the properties and reliability of the element. In particular, when the semiconductor element is a power semiconductor element which controls large current, the temperature of the semiconductor element is apt to be high. Thus, the diffusion described above is likely to occur. Further, when the semiconductor element is a SiC semiconductor element operable under high temperature, operation under high temperature using its feature can significantly cause the diffusion.

To solve the above problem, it is an object of the present invention to provide a power semiconductor device that reduces reliability degradation resulting from Cu diffusion into a polyimide layer as a protective film, while maintaining favorable joining of a Cu wire, and to provide a method for manufacturing such a power semiconductor device.

Means to Solve the Problem

A power semiconductor device in the present invention includes a semiconductor layer, an electrode, a polyimide layer, a copper layer, and a copper wire. The electrode is disposed on the semiconductor layer. The polyimide layer has an opening disposed on the electrode, covers the edge of the electrode, and extends onto the electrode. The copper layer is disposed on the electrode within the opening, and located away from the polyimide layer on the electrode. The copper wire has one end joined on the copper layer.

A method for manufacturing a power semiconductor device in the present invention includes the following steps. An electrode is formed on a semiconductor layer. A polyimide layer is formed; the polyimide layer has an opening disposed on the electrode, covers the edge of the electrode, and extends onto the electrode. A copper layer is formed on the electrode within the opening, the copper layer being located away from the polyimide layer on the electrode. One end of a copper wire is joined onto the copper layer, the copper wire having a diameter of 100 µm or more. The step of joining the one end of the copper wire is performed to the copper layer located away from the polyimide layer by a distance greater than half the thickness of the copper layer.

Effects of the Invention

The power semiconductor device in the present invention, which includes the copper wire joined on the copper layer, maintains favorable joining. Moreover, the copper layer is located away from the polyimide layer in post-wire-bonding operation. Consequently, Cu-atom diffusion into the polyimide layer under high-temperature operation is reduced. This reduces reliability degradation resulting from Cu diffusion.

The method for manufacturing a power semiconductor device in the present invention, in which the copper wire is joined onto the copper layer, maintains favorable joining. Moreover, the copper layer is located away from the polyimide layer by a distance greater than half the thickness of the copper layer at the time of pre-wire-bonding. This prevents the copper layer from being in contact with the polyimide layer if the copper layer is deformed by the impact of wire bonding. Consequently, Cu-atom diffusion into the polyimide layer under high-temperature operation is reduced. This reduces reliability degradation resulting from Cu diffusion.

These and other objects, features, aspects and advantages of the present invention will become more apparent from the following detailed description of the present invention when taken in conjunction with the accompanying drawings.

DESCRIPTION OF EMBODIMENT(S)

The embodiments of the present invention will be described with reference to the drawings.

First Embodiment (Configuration)

Figure 1:
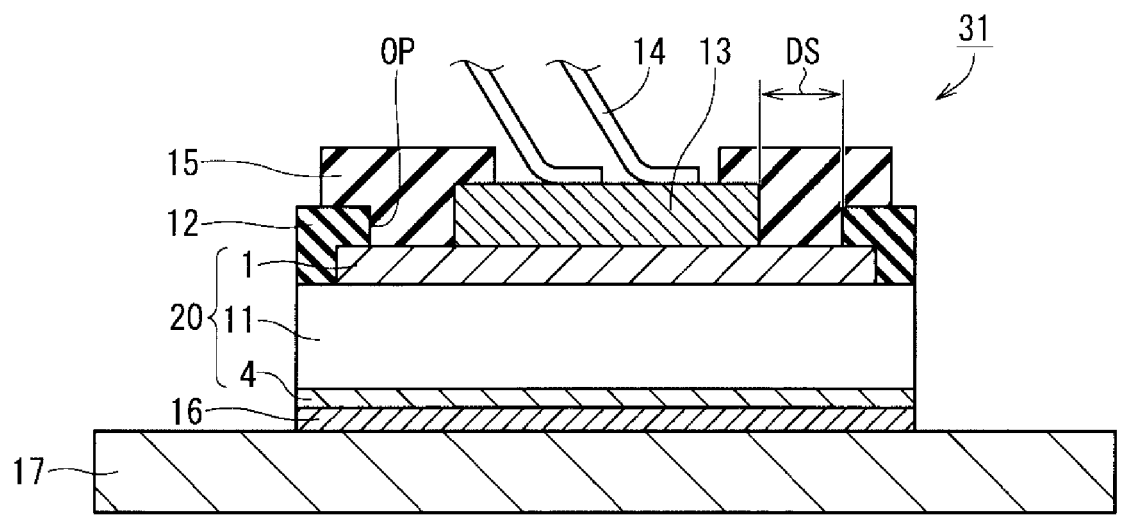
FIG. 1 is a schematic cross-sectional view of the configuration of a power semiconductor device according to a first embodiment of the present invention.
Figure 2:
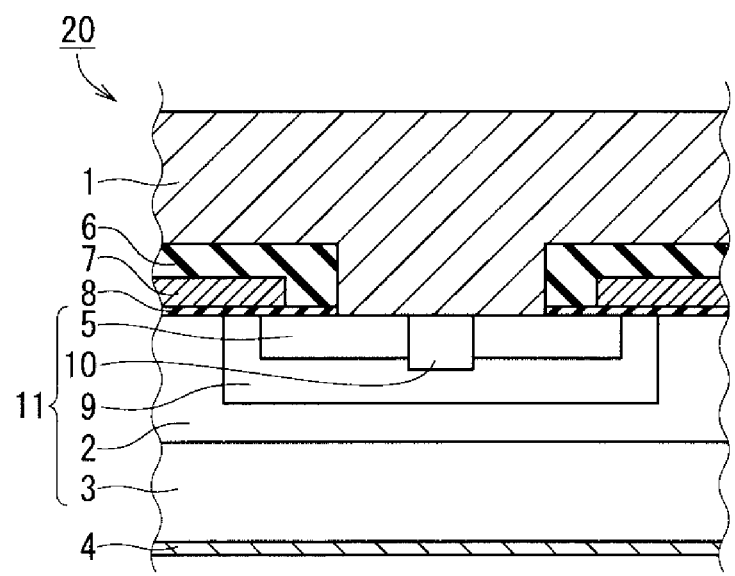
FIG. 2 is a schematic partial cross-sectional view of the configuration of a semiconductor element included in the power semiconductor device in FIG. 1.

Referring to FIG. 1, a power module 31 (power semiconductor device) includes a power MOSFET 20 (power semiconductor element), a polyimide layer 12, a Cu layer 13 (copper layer), Cu wires 14 (copper wires), and a sealant 15. In a first embodiment, the power module 31 further includes a base plate 17 supporting the power MOSFET 20 with a joining material 16 interposed therebetween. The power MOSFET 20 has an epitaxial substrate 11 (semiconductor layer) and an Al electrode 1 (aluminum electrode). Referring to FIG. 2, the power MOSFET 20 in the present embodiment further has a back-surface electrode 4, a gate insulating film 8, a gate electrode 7, and an interlayer insulating film 6.

The epitaxial substrate 11 is made of SiC. The Al electrode 1 is disposed on the epitaxial substrate 11.

The polyimide layer 12 covers the edge of the Al electrode 1 and extends onto the Al electrode 1. The polyimide layer 12 has an opening OP disposed on the Al electrode 1. The polyimide layer 12 extends onto the Al electrode 1 from the chip end of the power MOSFET 20. Thus, the polyimide layer 12 is formed also on a portion of a surface of the power MOSFET 20 around the Al electrode 1 where the Al electrode 1 is not formed. In other words, the polyimide layer 12 is formed on an element peripheral region surrounding the periphery of the center of the Al electrode 1. The polyimide layer 12 serves as a protective film protecting the element peripheral region.

The Cu layer 13 is disposed on the Al electrode 1 within the opening OP of the polyimide layer 12. The Cu layer 13 is located away from the polyimide layer 12 on the Al electrode 1. The Cu layer 13 thus has a width (dimension in a lateral direction in the drawing) smaller than the width of the opening OP. In other words, the Cu layer 13 is smaller than the opening OP and is contained in the opening OP, in plan view. The Cu layer 13 preferably has a thickness (dimension in a vertical direction in the drawing) of 10 μm or more and 100 μm or less.

The Cu wires 14 each have one end and the other end (not shown). The one end is joined on the Cu layer 13. The other end is joined to an external structure of the power MOSFET 20. Accordingly, the power MOSFET 20 is electrically connected to the external structure. The number of Cu wires 14 and the diameter of the Cu wire 14 can be optionally specified in accordance with the magnitude of current. The Cu wire 14, a bonding wire used for a power semiconductor element, such as the power MOSFET 20, commonly has a diameter of 100 μm or more for the passage of a large current.

The sealant 15 seals a gap between the polyimide layer 12 and the Cu layer 13. The sealant 15 is preferably made of any of a silicone-based material, an epoxy-based material, and a phenol-based material.

The Al electrode 1 is made of pure aluminum or conductor material whose main component is aluminum. The "conductor material whose main component is aluminum" is a conductor material containing equal to or more than 50 wt % of Al, and is typically an alloy of aluminum. Examples of an element other than Al, or an added element, include Si and Cu. The Cu layer 13 is made of pure copper or conductor material whose main component is copper. The "conductor material whose main component is copper" is specifically a conductor material containing equal to or more than 50 wt % of Cu, and is typically an alloy of copper. The Cu layer 14 is made of a conductor material whose main component is pure copper or copper. It is noted that the Cu wire 14 may have a surface coated with metal, such as Al, or with an organic material.

The epitaxial substrate 11 has a monocrystalline substrate 3 and an epitaxial layer disposed thereon. The epitaxial layer has a drift layer 2, a base region 9, a source region 5, and a base contact region 10. The base region 9 is disposed on a surface of the drift layer 2. The source region 5 and the base contact region 10 are disposed within the base region 9. The base region 9, the source region 5, and the base contact region 10 can be formed through ion implantation to the drift layer 2 and annealing for activation thereafter.

The gate electrode 7 is disposed on the epitaxial substrate 11 so as to face the base region 9 with the gate insulating film 8 interposed therebetween. The base region 9 has a portion serving as a channel region, the portion facing the gate electrode 7 with the gate insulating film 8 interposed therebetween. In the channel region, a turn-on operation induces an inversion layer. The gate insulating film 8 may be made of silicon oxide. The gate electrode 7 may be made of polysilicon.

The interlayer insulating film 6 covers the gate electrode 7 and has a contact hole. The Al electrode 1 is disposed on the interlayer insulating film 6, and extends through the contact hole to the source region 5 and the base contact region 10. The interlayer insulating film 6 may be made of silicon oxide.

The back-surface electrode 4 is disposed on the back surface of the epitaxial substrate 11, that is, on the back surface of the monocrystalline substrate 3. In the power MOSFET 20, the back-surface electrode 4, which is a drain electrode, faces the Al electrode 1, which is a source electrode, in the thickness direction of the epitaxial substrate 11, that is, in a vertical direction. Thus, the power MOSFET 20 is a vertical semiconductor element.

(Manufacturing Method)

The following describes a method for manufacturing the power module 31.

Firstly, the power MOSFET 20 is produced using a common method. At this time, the Al electrode 1 is formed on the epitaxial substrate 11 (FIG. 3: step S10).

Figure 3:
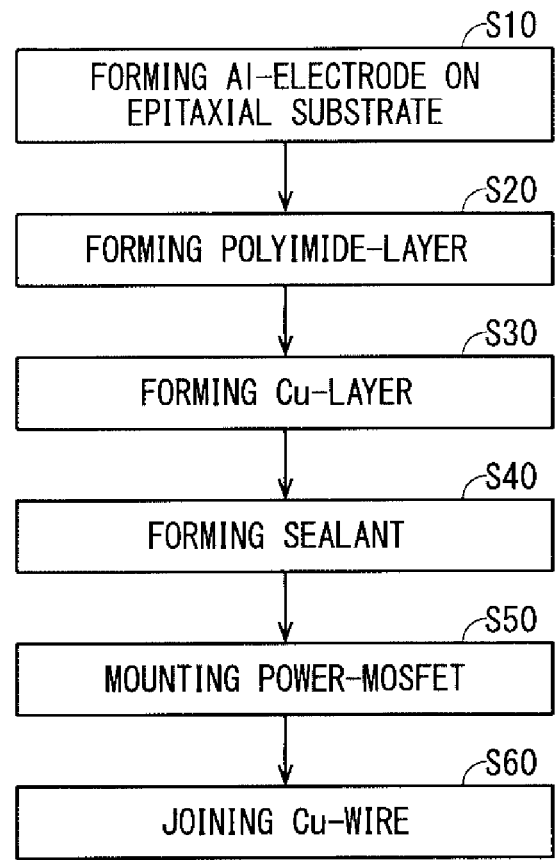
FIG. 3 is a flowchart schematically illustrating one example of the configuration of a method for manufacturing the power semiconductor device in FIG. 1.

Subsequently, the polyimide layer 12, having the opening OP and covering the edge of the Al electrode 1, is formed (FIG. 3: step S20). Moreover, the Cu layer 13, located away from the polyimide layer 12, is formed on the Al electrode 1 within the opening OP. These steps are performed in any order. The polyimide layer 12 and the Cu layer 13 are placed away from each other. To be specific, a distance DS (the shortest distance) between the Cu layer 13 and the polyimide layer 12 is greater than half the thickness of the Cu layer 13.

Subsequently, the sealant 15 is formed (FIG. 3: step S40). It is noted that the formation of the sealant 15 may be omitted. That is, the step S40 may be omitted. Alternatively, the step S40 may come after a step S50 or a step S60, which will be described later on.

Subsequently, the power MOSFET 20 is mounted (FIG. 3: step S50). To be specific, the power MOSFET 20 is electrically and mechanically joined to the base plate 17 using the joining material 16 made of, for instance, solder.

Subsequently, the power MOSFET 20 undergoes wire bonding (FIG. 3: step S60). Accordingly, the one end of the Cu wire 14 is joined onto the Cu layer 13. The joining of the one end of the Cu wire 14 is performed to the Cu layer located away from the polyimide layer 12 by the distance DS. As earlier described, the distance DS is greater than half the thickness of the Cu layer 13.

The impact of wire bonding can deform the Cu layer 13 toward the end of the power MOSFET 20. In other words, the Cu layer 13 can be deformed so that the edge of the Cu layer 13 approaches the polyimide layer 12. A simple estimate puts the degree of deformation at the thickness of the Cu layer 13 at maximum. However, the repetition of an experiment and evaluation done by the inventors has revealed that the degree of deformation is smaller than half the thickness of the Cu layer 13. To be specific, the inventors conducted an experiment of bonding a Cu wire to one of two Cu layers placed at an interval, in order to find a relationship between the thickness of the Cu layer and the degree of deformation of the Cu layer when the Cu wire is joined thereto. The thickness of the Cu layer was set to be 20 µm and 30 µm. The interval was set to be 5 µm, 10 µm, 15 µm, 20 µm, 25 µm, and 30 µm. After the bonding, the inventors evaluated whether the two Cu layers were in contact with each other through the presence or absence of electrical conduction. Table 1 shows the results.

TABLE 1

| Interval | Thickness [µm] | |
| --- | --- | --- |
| [µm] | 20 | 30 |
| 5 | Contact | Contact |
| 10 | Non-Contact | Contact |
| 15 | Non-Contact | Non-Contact |
| 20 | Non-Contact | Non-Contact |
| 25 | Non-Contact | Non-Contact |
| 30 | Non-Contact | Non-Contact |

The results have revealed that an interval of 10 µm or more for a 20-µm thickness, and an interval of 15 µm or more for a 30-µm thickness avoid contact resulting from deformation. As such, placing the Cu layer 13 that is to undergo wire bonding away from the polyimide layer 12 by a distance greater than half the thickness of the Cu layer 13 avoids contact between the Cu layer 13 and the polyimide layer 12 after deformation resulting from wire bonding. Accordingly, the distance DS is preferably greater than half the thickness of the Cu layer 13, but may be smaller than the thickness of the Cu layer 13.

It is noted that the distance DS may be greater than half the thickness of the Cu layer 13 at the time of post-bonding also, that is, at the time of completion of the power module 31. This condition is satisfied if the distance DS is designed with sufficient allowance.

(Effect)

The present embodiment, in which the Cu wire 14 is joined to the Cu layer 13, maintains favorable joining. Further, the Cu layer 13 is located away from the polyimide layer 12 by the distance DS greater than half the thickness of the Cu layer 13 at the time of pre-wire-bonding. This prevents the Cu layer 13 from being in contact with the polyimide layer 12 if the Cu layer 13 is deformed by the impact of wire bonding. Consequently, Cu-atom diffusion into the polyimide layer 12 under high-temperature operation is reduced. This reduces reliability degradation resulting from Cu diffusion. To be specific, prevented is the degradation in protection performance of the polyimide layer 12, the occurrence of a leak current in an element, and other unfavorable situations. This improves yield and productivity in manufacturing the power module 31.

The power module 31 is commonly a semiconductor device through which a relatively large current flows. Thus, the power module 31, particularly the power MOSFET 20, is apt to have high temperature. Under such high temperature, Cu atoms tend to diffuse into the polyimide layer 12 if the Cu layer is in contact with the polyimide layer 12. The present embodiment prevents such diffusion.

The epitaxial substrate 11 is made of SiC, thereby enabling high-temperature operation. Under high temperature, Cu atoms can tend to significantly diffuse into the polyimide layer 12 if the Cu layer is in contact with the polyimide layer 12. The present embodiment prevents such diffusion.

The sealant 15 prevents the Cu layer 13 from being in contact with the polyimide layer 12 with more certainty if the Cu layer 13 is deformed by, for instance, thermal stress resulting from high-temperature operation, or an external force. The sealant 15 is preferably made of any of a silicone-based material, an epoxy-based material, and a phenol-based material. Cu atoms are less likely to diffuse into these materials. This reduces Cu-atom diffusion into the polyimide layer 12 through the sealant 15.

The Cu layer 13 having a thickness of 10 µm or more effectively relieves an impact on the power MOSFET 20 when the Cu wire 14 is joined through wire bonding. This prevents damage to the power MOSFET 20 in wire bonding. This effect is sufficiently obtained even when the Cu layer 13 has a thickness of about 100 µm or less. A thickness of more than about 100 m in the Cu layer 13, which requires an excessively long time for forming the Cu layer 13, can lower productivity.

MODIFICATION

Figure 4:
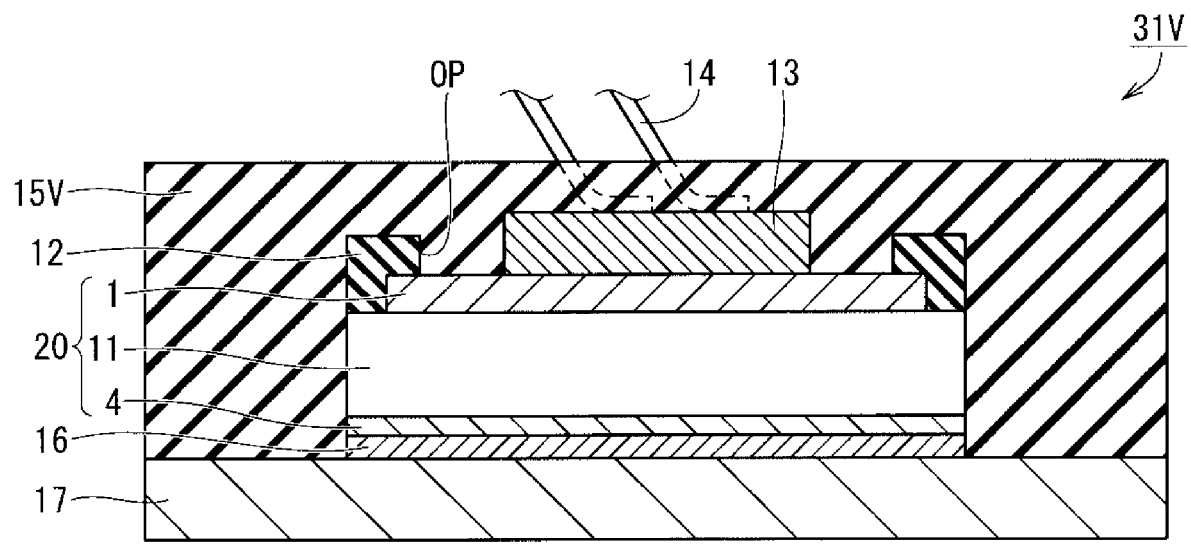
FIG. 4 is a cross-sectional view of a modification in FIG. 1.

Referring to FIG. 4, a power module 31V (power semiconductor device) according to a modification includes a sealant 15V instead of the sealant 15 (FIG. 1). The sealant 15V not only seals a gap between the polyimide layer 12 and the Cu layer 13, but also covers all over the front and side surfaces of the power MOSFET 20. The sealant 15V also covers the one end of the Cu wire 14, that is, an end joined to the Cu layer 13. The step S40 (FIG. 3) for forming the sealant 15V comes after the step S60. It is noted that a preferable material of the sealant 15V is the same as that of the sealant 15.

The power module 31 (FIG. 1) or the power module 31V (FIG. 4) may include a barrier metal layer between the Al electrode 1 and the Cu layer 13. The barrier metal layer can be made of, for instance, Ti, TiN, Ta, TaN, W, WN, or TiW.

The epitaxial substrate 11 (semiconductor layer) in part or in whole may be made of a semiconductor material other than SiC. For instance, Si may be used as the semiconductor material.

The power module 31 (FIG. 1) or the power module 31V (FIG. 4) may include any power semiconductor element, not limited to a power MOSFET. Examples of the power semiconductor element include a transistor and a diode. An example of the transistor is a transistor having an insulated gate electrode; and specific examples include a Metal Insulator Semiconductor Field Effect Transistor (MISFET), such as a MOSFET, and an Insulated Gate Bipolar Transistor (IGBT). Examples of the diode include a Schottky barrier diode and a PN diode.

It is noted that the modification can be applied to the following second and third embodiments.

Second Embodiment

Figure 5:
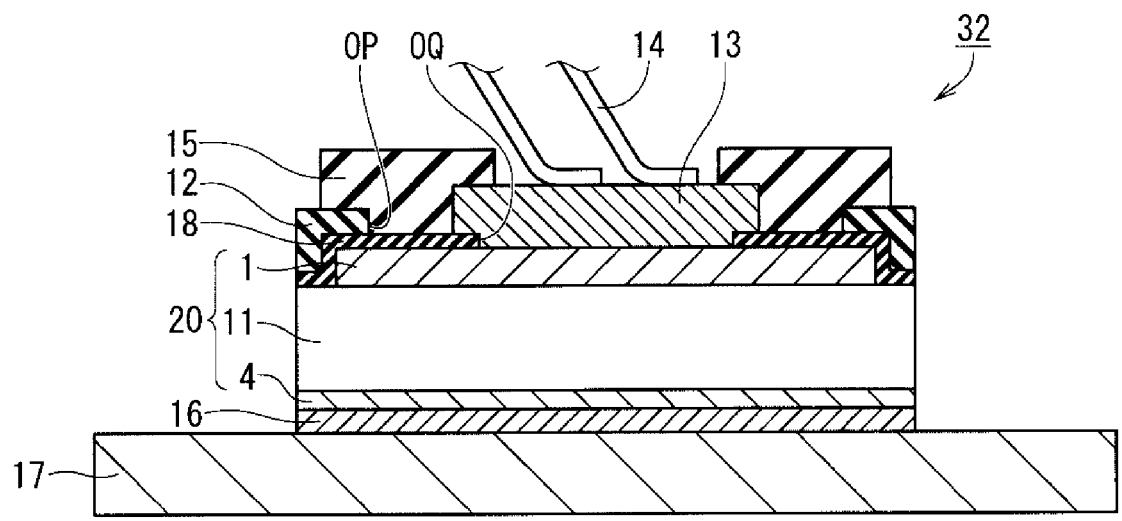
FIG. 5 is a schematic cross-sectional view of the configuration of a power semiconductor device according to a second embodiment of the present invention.

Referring to FIG. 5, a power module 32 (power semiconductor device) includes a silicon nitride layer 18. The silicon nitride layer 18 is partly disposed on the Al electrode 1. The silicon nitride layer 18 extends onto the Al electrode 1 from the chip end of the power MOSFET 20. Thus, the silicon nitride layer 18 is formed also on a portion of a surface of the power MOSFET 20 around the Al electrode 1 where the Al electrode 1 is not formed. In other words, the silicon nitride layer 18 is formed on an element peripheral region surrounding the periphery of the center of the Al electrode 1. The silicon nitride layer 18 covers the edge of the Al electrode 1. The silicon nitride layer 18 has an opening OQ disposed on the Al electrode 1. The opening OQ has a width narrower than the width of the opening OP. In other words, the opening OQ is smaller than the opening OP and is contained in the opening OP, in plan view.

The Cu layer 13 has an edge on the silicon nitride layer 18. The Cu layer 13 has a width wider than the width of the opening OQ. In other words, the opening OQ is smaller than the copper layer 13 and is contained in the copper layer 13, in plan view. The copper layer 13 is in contact with the Al electrode 1 within the opening OQ. The polyimide layer 12 is disposed on the silicon nitride layer 18.

To manufacture the power module 32, a step of forming the silicon nitride layer 18 is added to the process steps for manufacturing the power module 31 (FIG. 1). The step of forming the silicon nitride layer 18 comes after the formation of the Al electrode 1 and before the formation of the polyimide layer 12 and the Cu layer 13.

The power MOSFET 20 is commonly a semiconductor element through which a relatively large current flows. The power MOSFET 20 thus has a relatively large area of element. The Cu layer 13 accordingly has a relatively large area as well. Moreover, the Cu layer 13 needs to have a large thickness sufficient to relieve the impact of wire bonding. For this reason, the Cu layer 13 has a large area and a large thickness. As a result, the Cu layer 13 is apt to have large stress. This stress tends to concentrate particularly under the edge of the Cu layer 13. If the concentration of stress is applied directly to the Al electrode 1, the Al electrode 1 can have cracking.

According to the present embodiment, the silicon nitride layer 18 is disposed between the edge of the Cu layer 13 and the Al electrode 1. Consequently, the Al electrode 1 is protected from the concentration of stress. This prevents cracking in the Al electrode 1.

The silicon nitride layer 18 preferably has a thickness of 50 nm or more and 2000 nm or less. An excessively small thickness fails to sufficiently protect the Al electrode 1. On the other hand, an excessively large thickness produces an excessively large stress in the silicon nitride layer 18, thus involving a great degree of warping in the epitaxial substrate 11. The epitaxial substrate 11 with a great degree of warping, which, for instance, causes an error when automatically transferred, is hard to handle. In addition, the power MOSFET 20, having the epitaxial substrate 11, warps to a great degree as well. This tends to produce defects when the power MOSFET 20 is assembled.

The other configurations are almost the same as those in the first embodiment. Accordingly, the same or corresponding components are denoted by the same signs, and will not be thus elaborated upon here. It is noted that the present embodiment obtains an effect almost similar to that in the first embodiment.

Third Embodiment

Figure 6:
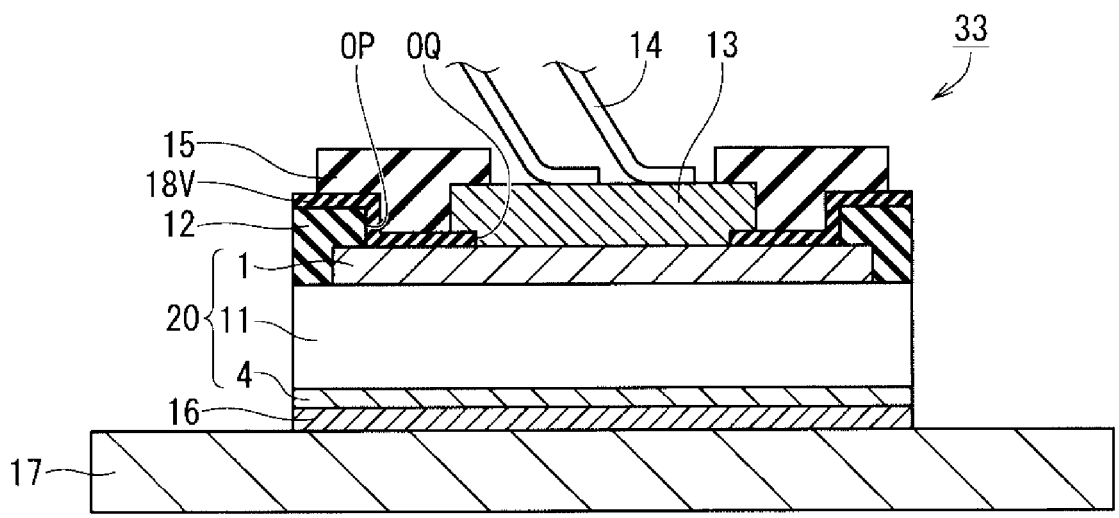
FIG. 6 is a schematic cross-sectional view of the configuration of a power semiconductor device according to a third embodiment of the present invention.

Referring to FIG. 6, a power module 33 (power semiconductor device) includes a silicon nitride layer 18V. Like the silicon nitride layer 18 (FIG. 2: second embodiment), the silicon nitride layer 18V has the opening OQ. The Cu layer 13 thus has an edge on the silicon nitride layer 18V. A preferable thickness of the silicon nitride layer 18V is similar to that of the silicon nitride layer 18.

The arrangement of the silicon nitride layer 18V is similar to that of the silicon nitride layer 18 in plan view. On the other hand, the arrangements of these layers are different from each other in cross-sectional view (a view in FIG. 6). To be specific, the silicon nitride layer 18V is disposed over the upper and side surfaces of the polyimide layer 12, whereas the silicon nitride layer 18 is disposed under the polyimide layer 12. Accordingly, the silicon nitride layer 18V separates the polyimide layer 12 from the Cu layer 13.

To manufacture the power module 33, a step of forming the silicon nitride layer 18V comes after the formation of the polyimide layer 12 and before the formation of the Cu layer 13. The other process steps may be similar to those for manufacturing the power module 31.

According to the present embodiment, the silicon nitride layer 18V is disposed between the Cu layer 13 and the polyimide layer 12. This prevents the Cu layer 13 from being in contact with the polyimide layer 12 with more certainty. Consequently, Cu-atom diffusion into the polyimide layer 12 under high-temperature operation is reduced with more certainty. This reduces reliability degradation resulting from Cu diffusion with more certainty.

The other configurations are almost the same as those in the second embodiment. Accordingly, the same or corresponding components are denoted by the same signs, and will not be thus elaborated upon here. It is noted that the present embodiment obtains an effect almost similar to that in the second embodiment.

It is noted that in the present invention, the individual embodiments can be freely combined, or can be modified and omitted as appropriate, within the scope of the invention. While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS 20 power MOSFET (power semiconductor element), 1 Al electrode (electrode), 11 epitaxial substrate (semiconductor layer), 12 polyimide layer, 13 Cu layer (copper layer), 14 Cu wire (copper wire), 15, 15V sealant, 18, 18V silicon nitride layer, 31, 31V, 32, 33 power module.

The invention claimed is:

1. A power semiconductor device comprising:
   a semiconductor layer;
   an electrode disposed on the semiconductor layer;
   a polyimide layer comprising an opening disposed on the electrode, the polyimide layer covering an edge of the electrode and extending onto the electrode;
   a copper layer disposed on the electrode within the opening, and located away from the polyimide layer on the electrode; and
   a copper wire comprising one end joined on the copper layer,
   wherein the copper layer has a larger area than a region in which the copper wire is joined to the copper layer, and
   a distance between the copper layer and the polyimide layer is greater than half a thickness of the copper layer.

2. The power semiconductor device according to claim 1, further comprising a silicon nitride layer separating the polyimide layer from the copper layer.

3. The power semiconductor device according to claim 1, wherein the copper wire has a diameter of 100 μm or more.

4. The power semiconductor device according to claim 1, further comprising a sealant sealing a gap between the polyimide layer and the copper layer,
   wherein the sealant is made of any of a silicone-based material, an epoxy-based material, and a phenol-based material.

5. The power semiconductor device according to claim 1, wherein at least part of the semiconductor layer is made of silicon carbide.

6. A method for manufacturing a power semiconductor device, the method comprising:
   forming an electrode on a semiconductor layer;
   forming a polyimide layer comprising an opening disposed on the electrode, the polyimide layer covering an edge of the electrode and extending onto the electrode;
   forming, on the electrode within the opening, a copper layer located away from the polyimide layer on the electrode; and
   joining one end of a copper wire having a diameter of 100 μm or more onto the copper layer,
   wherein the joining of the one end of the copper wire is performed to the copper layer located away from the polyimide layer by a distance greater than half a thickness of the copper layer.

7. A power semiconductor device comprising:
   a semiconductor layer;
   an electrode disposed on the semiconductor layer;
   a polyimide layer comprising an opening disposed on the electrode, the polyimide layer covering an edge of the electrode and extending onto the electrode;
   a copper layer disposed on the electrode within the opening, and located away from the polyimide layer on the electrode;
   a copper wire comprising one end joined on the copper layer and having a diameter larger than a thickness of the copper layer; and
   a silicon nitride layer partly disposed on the electrode,
   wherein the copper layer comprises an edge directly contacting the silicon nitride layer.

8. The power semiconductor device according to claim 7, wherein the silicon nitride layer separates the polyimide layer from the copper layer.

9. The power semiconductor device according to claim 7, wherein the copper wire has the diameter of 100 μm or more.

10. The power semiconductor device according to claim 7, further comprising a sealant sealing a gap between the polyimide layer and the copper layer,
    wherein the sealant is made of any of a silicone-based material, an epoxy-based material, and a phenol-based material.

11. The power semiconductor device according to claim 7, wherein at least part of the semiconductor layer is made of silicon carbide.

* * * * *